United States Patent
Boyle et al.

[11] Patent Number: 6,020,646
[45] Date of Patent: Feb. 1, 2000

[54] INTERGRATED CIRCUIT DIE ASSEMBLY

[75] Inventors: John J. Boyle, Natick; William L. Robbins, Newton Center, both of Mass.

[73] Assignee: The Charles Stark Draper Laboratory, Inc., Cambridge, Mass.

[21] Appl. No.: 08/985,807

[22] Filed: Dec. 5, 1997

[51] Int. Cl.[7] .................. H01L 31/0203; H01L 27/15; H01L 23/48
[52] U.S. Cl. .................. 257/783; 257/83; 257/88; 257/433; 257/434; 257/680; 257/681; 257/684; 257/700; 257/782
[58] Field of Search .................. 257/83, 88, 680, 257/684, 700, 723, 724, 782, 783, 433, 434, 681; 438/116; 361/783, 820

[56] References Cited

U.S. PATENT DOCUMENTS

| | | | |
|---|---|---|---|
| 4,044,374 | 8/1977 | Roberts et al. | 257/225 |
| 4,760,440 | 7/1988 | Bigler et al. | 257/680 |
| 5,021,888 | 6/1991 | Kondou et al. | 348/76 |
| 5,418,566 | 5/1995 | Kameishi | 348/294 |
| 5,495,450 | 2/1996 | Zollo et al. | 365/218 |
| 5,763,943 | 6/1998 | Baker et al. | 257/686 |
| 5,767,564 | 6/1998 | Kunimatsu et al. | 257/564 |
| 5,786,589 | 7/1998 | Segewa et al. | 361/820 |
| 5,867,368 | 2/1999 | Glenn | 361/783 |
| 5,869,855 | 2/1999 | Yoon et al. | 257/229 |
| 5,869,896 | 2/1999 | Baker et al. | 257/724 |
| 5,949,655 | 9/1999 | Glenn | 361/783 |

*Primary Examiner*—Olik Chaudhuri
*Assistant Examiner*—Alonzo Chambliss
*Attorney, Agent, or Firm*—Lappin & Kusmer LLP

[57] ABSTRACT

An integrated circuit (IC) die carrier assembly includes a thinned IC die mounted to a substrate or carrier. The IC die is mounted to the carrier via a thin layer of glass. The carrier facilitates fixturing and provides support during the lapping process used to thin the die. Ball bonding, wire bonding, thin film or thick film conductors can be used to interconnect the pads on the IC die to the pads on the carrier. The coefficients of the thermal expansion of the IC die and the carrier are closely matched to avoid damage to the IC die due to uneven expansion of the thinned IC die relative to the carrier. The IC die carrier assembly is better suited for ultrahigh vacuum and high temperature environments than conventional IC die carrier assemblies.

17 Claims, 5 Drawing Sheets

INTERGRATED CIRCUIT DIE ASSEMBLY

CROSS-REFERENCE TO RELATED APPLICATIONS

This application is related to commonly owned U.S. Ser. No. 08/986,259 entitled Integrated Circuit Header Assembly and Method for Making Same, by William Robbins.

STATEMENT REGARDING FEDERALLY SPONSORED RESEARCH

Not Applicable.

REFERENCE TO MICROFICHE APPENDIX

Not Applicable.

BACKGROUND OF THE INVENTION

This invention relates to integrated circuit (IC) or semiconductor die assemblies and, more particularly, to an assembly comprising an IC die mounted to a substrate or carrier and method for making the same. The semiconductor die assembly is acceptable for use in ultra-high vacuum and high temperature environments.

Integrated circuit devices are typically fabricated from semiconductor or silicon dies that are mounted in modules that can include supporting carriers or substrates and headers. In applications where the IC die is fragile or subject to further processing, the IC die can be mounted to a substrate or carrier to provide further support or facilitate further processing. Typically, the carriers or substrates are subsequently mounted to a header which includes pins or other leads which allow the device to be electrically and mechanically connected to the system in which it is to be used. The header can facilitate mounting the IC module to a circuit board, a mating socket or module housing or enclosure. Typically, fine gold wires are bonded to conductive pads on the die or the carrier and the header to establish electrical connections between the pins or leads of the header and the integrated circuit on the die.

In certain circumstances, it may be necessary to reduce the thickness of the die such as in the preparation of backside illumination charged coupled devices (CCDs). In the prior art, there are two methods of producing reduced thickness or "thinned" dies. One method includes ball bonding the die to a substrate to provide electrical connections between the die and the substrate and flowing an organic material between the die and the substrate to provide mechanical support for the die. After the organic material has set, the die can be thinned by a mechanical process such as lapping or a chemical process such as etching. The other method involves forming a glass or ceramic substrate onto the die at the wafer level. After the substrate is formed on the wafer, the die is thinned to the desired thickness and predefined areas of the die are removed to expose conductive pads which are bonded to the substrate.

The carrier assembly with the thinned die is subsequently mounted to a header which provides an array of pins or other means for electrically connecting the integrated circuit die to the remainder of the circuit. Typically, the header includes conductive pads which are electrically connected to the array of pins. Wire bonding is used to connect the conductive pads of the die to the conductive pads of the header.

These prior art methods are not acceptable for mounting back illumination electron bombarded charged coupled devices (EBCCDs). The use of organic materials for die attachment is not acceptable for use in ultrahigh vacuum environments because these materials outgas at levels which degrade the vacuum and reduce the EBCCD tube life. In addition, the temperatures necessary to bake out the organic materials to reduce outgassing, would damage the integrated circuit die. In the alternate method, glass having a coefficient of thermal expansion close to that of the die is cast as a substrate or carrier to the integrated circuit wafer. However, the processing temperatures required to fabricate the substrate on the wafer are higher than normal temperatures that are not acceptable for processing integrated circuit dies that use traditional metallurgies. In order to fabricate the IC die carrier assembly at high temperatures (800–900 degrees C.), the die must be fabricated from refractory metals which have a higher resistivity and thus yield slower operating speeds. In addition, the die must be specifically designed to allow etching from the backside to expose the conductive pad. Furthermore, at these high processing temperatures, stresses created by the different coefficients of thermal expansion of the die, the carrier and the material that attaches the die to the carrier can cause the die or the electrical connections of the die to the carrier to fail prematurely. Still further, the stresses created by the different coefficients of thermal expansion between the header and the carrier can also cause the device to fail prematurely.

Accordingly, it is an object of this invention to provide an improved circuit device.

It is another object of the invention to provide an improved circuit device that is suitable for use in ultrahigh vacuum environments.

It is yet another object of the invention to provide an improved circuit device that is suitable for processing and use in higher temperature environments.

It is a further object of the invention to provide an improved circuit device comprising an integrated circuit die mounted to a carrier wherein thermal coefficients of expansion of the die and the carrier are relatively close to reduce the stress associated with thermal expansion of different materials having different expansion coefficients and the layer of material binding the die to the carrier is relatively thin whereby its coefficient of thermal expansion does not detrimentally impact the IC die carrier assembly.

It is a further object of the invention to provide an improved method of mounting an integrated circuit die to a carrier or substrate.

It is a further object of the invention to provide an improved method of mounting a electron bombarded charged coupled device (EBCCD) to a carrier in order to permit the EBCCD to be thinned.

SUMMARY OF THE INVENTION

The present invention is directed integrated circuit devices such as those fabricated using silicon and other semiconducting materials in wafers. In accordance with the invention, the integrated circuit device includes an IC die which has conductive pads for establishing connections with the circuit contained therein and a carrier or substrate to which the integrated circuit die is mounted. The carrier can also include conductive pads to facilitate electrical connections with the IC. In order to effect mechanical attachment of the IC die to the carrier, a mounting material is applied between the die and carrier. In order to effect electrical connections between the conductive pads on the die and conductive pads on the carrier, one or more conducting elements can be used.

The mounting material is applied as an adhesive layer between the IC die and the carrier. Preferably, the mounting material is an inorganic material having a predefined or controlled density. In one embodiment the mounting material includes a glass powder or frit. The glass frit can be reflowed or at least partially sintered in order to fill the space between the IC die and the carrier. The carrier is selected such that the coefficient of thermal expansion of the carrier material is compatible with the thermal expansion characteristics of the die to avoid stress concentrations and failure. Preferably, the coefficient of thermal expansion of the carrier material is selected to be as close to the coefficient of thermal expansion of the IC die as possible. In addition, the thickness of the layer of the mounting material is kept to a minimum in order to prevent the thermal expansion characteristics of the mounting material from affecting the IC die carrier assembly.

The conducting elements connect the conductive pads of the IC die to the conductive pads of the carrier. The IC die carrier assembly can be subsequently attached to a header assembly and the conductive pads of the carrier can be connected to conductive pads or leads on the header to facilitate electrical connection to the IC. In one embodiment, the conducting elements include ball bonds which include balls of a metallic material that are compressed into place between the conductive pads of IC die and the conductive pads of the carrier. In an alternative embodiment, wire bonds which include fine wires bonded to conductive pads of the IC die and the carrier. In a third embodiment, a thin or thick film of a conductive material is applied to the surfaces of the IC die carrier assembly to electrically connect the conductive pads of the IC die to the conductive pads of the carrier.

One process for fabricating the IC die carrier assembly includes the steps of: A) attaching the ball bonding balls to the conductive pad on a first side of the IC die; B) applying the mounting material, preferably glass frit, to the first side of the IC die; C) registering the bonding balls attached to the first side of the IC die with conductive pads on a first side of the carrier; and D) under controlled temperature conditions, applying pressure to the join the IC die and the carrier.

In step B, the application of the mounting material can include the substeps of reflowing or otherwise adhering at least one layer of glass having a controlled density to the first side of the IC die and lapping the first side of the IC die whereby the layer of glass and the ball bonding balls are the same thickness. In an alternative embodiment, the mounting material can be applied in a plurality of layers, each being heated to achieve predefined sinter density or otherwise adhered to the next layer to build up the thickness of the glass layer to be the same thickness as the ball bonding balls. Alternatively, the layers can be made thicker than the ball bonding balls and the first side can be subject to a lapping process to expose the ball bonding balls.

An alternative process of fabricating the IC die carrier assembly includes the steps of: A) attaching the ball bonding balls to the conductive pad on a first side of the IC die; B) applying the mounting material, preferably glass frit, to the first side of the carrier; C) removing portions of the mounting material, preferably by etching, to expose the conductive pads on the first side of the carrier; D) registering the bonding balls attached to the first side of the IC die with conductive pads on a first side of the carrier; and E) under controlled temperature conditions, applying pressure to join the IC die and the carrier.

In the alternative embodiment, the height of the ball bonding balls can be made uniform in step A to facilitate fabrication. One method includes coining each of the balls in place on the first side of the IC die whereby the ball bonding balls extend a uniform distance from the first side of the IC die. Alternatively, the balls can be subject to lapping process whereby the ball bonding balls extend a uniform distance from the first side of the IC die.

A third alternative process for fabricating the IC die carrier assembly includes the steps of: A) providing a thin layer of a mounting material, such as glass frit, between the IC die and the carrier; B) reflowing the mounting material to join the IC die and carrier; C) removing a portion of the IC die to expose at least a portion of the conductive pads on the IC die; and D) electrically connecting the exposed portions of the conductive pads on the IC die to conductive pads on the carrier.

The electrical connections can be established by any known means. In one embodiment, wire bonds are used to connect the exposed pads on the IC die to the pads on the carrier. In a preferred embodiment, a thin or thick layer or film of a conductive material is applied to the IC die carrier assembly to connect the exposed pads on the IC die to the pads on the carrier.

In one preferred embodiment, the IC die is an electron bombarded charged coupled device (EBCCD), such as those used in video imaging systems including television and surveillance cameras. The EBCCD is preferably a backside illuminated type device which is approximately 10 to 20 microns thick. The EBCCD die is mounted to the carrier and an etching process is used to thin the die to 10 to 20 microns. Preferably, the electrical connections are established after thinning.

After the IC die has been assembled with the carrier and the electrical connections having been established, the resulting IC die carrier assembly can be mounted to a header or header assembly. Typically, the header assembly includes a plurality of conductive pads connected to electrical contacts such as pins or leads. The conductive pads on the header can be connected to the conductive pads of the carrier via wire bonding or ball bonding. The electrical contacts can be used to connect the IC device to a socket or printed circuit board to facilitate connection to the integrated circuit.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

The present invention is directed to an electronic integrated circuit module that is suitable for use in ultrahigh vacuum and high temperature environments. Typically, the integrated circuit (IC) is embodied in an IC die which is formed on a wafer containing one or more IC dies. Each IC die is separated from the wafer and assembled in a module that facilitates mounting the module to a device such as a printed circuit board, a component housing or vacuum tube. The module typically includes a header which provides a plurality of pins or leads that facilitate electrical (and sometimes mechanical) connection of the IC in the module to the circuit and/or housing.

In the preferred embodiment, the IC die is an electron bombarded charged coupled device (EBCCD) die which is configured for backside illumination. Thus, the EBCCD die must be backside thinned to approximately 10 to 20 microns. Preferably, the unthinned EBCCD die is mounted to a carrier or substrate which provides mechanical support during and after the thinning process. Preferably, the EBCCD die includes an array of charge coupled devices (CCD sensors or pixels) that are effective for photon or electron activation. In accordance with the invention, arrays of up to 1000 by 1000 pixels and larger may be fabricated.

Figure 1:
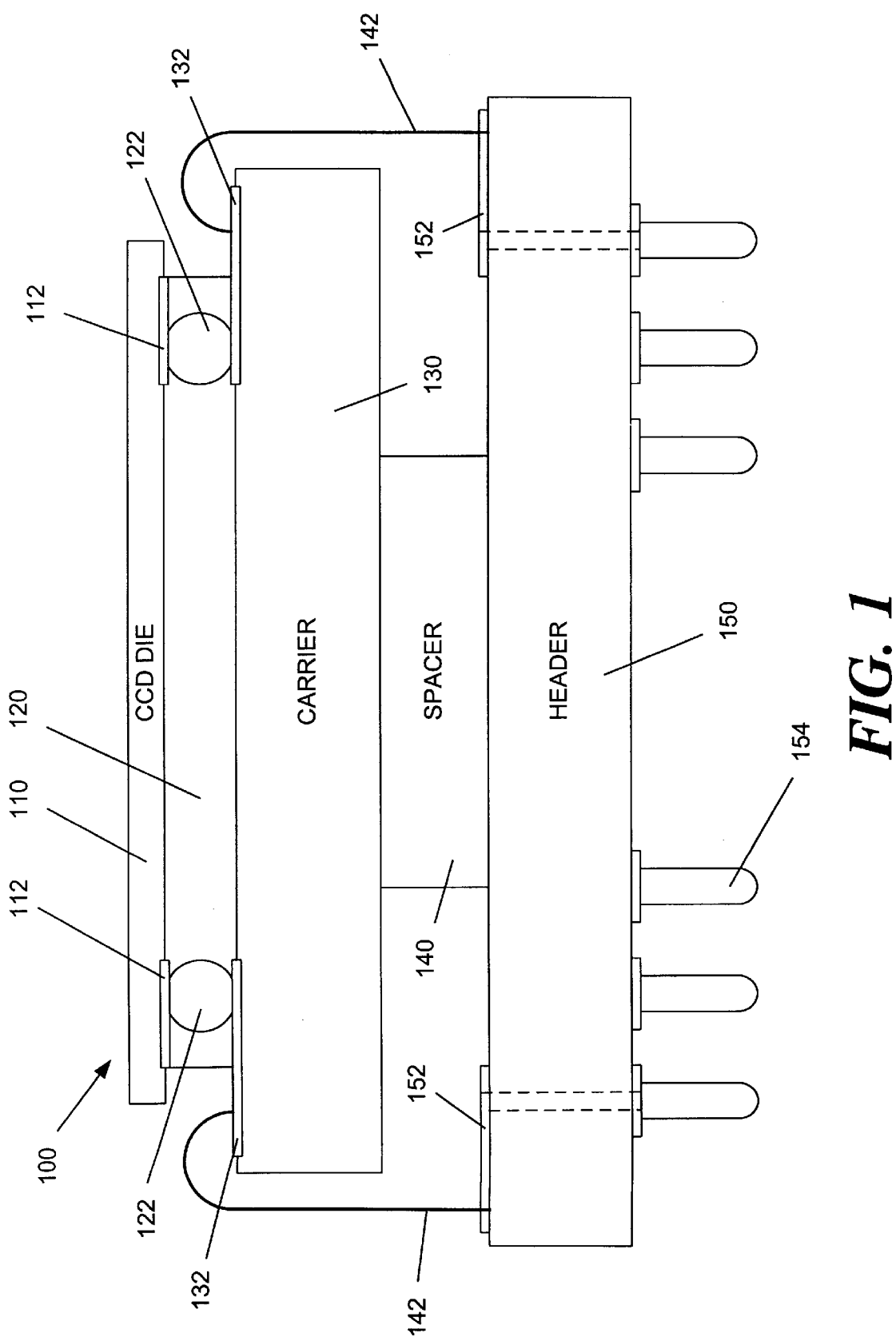
FIG. 1 is a diagrammatic view of a circuit device according to the present invention.

FIG. 1 shows a circuit device 100 in accordance with the present invention. The device 100 includes a thinned CCD array die 110, the front side of which is mechanically attached to a carrier 130 by a mounting material, preferably a layer of glass 120 having a predefined thickness and density. The front side of the thinned CCD die 110 includes conductive pads 112 which are electrically connected to the CCD array integrated circuit. The carrier 130 also includes conductive pads 132 which are congruent to or overlap the conductive pads 112 of the die 110. Ball bonds 122 comprising small metal balls are attached to the pads of the die 112 and the pads of carrier 132 and form the electrical connections between pads 112 the die 110 and the pads 132 of the carrier 130. In the preferred embodiment, the balls 112 are formed of gold or a gold alloy and have an initial diameter of approximately 0.001 to 0.004 inches. During the assembly process, the layer of glass 120 applied is approximately the same thickness as the height of the balls 112. The layer of glass 120 and the balls 112 are lapped to expose the balls 112 and reduce the thickness to approximately 0.001 to 0.002 inches. Under controlled temperature conditions, the glass layer 120 is reflowed and compressed between the CCD die 110 and the carrier 130. After the CCD die carrier assembly cools, the glass layer 120 and the balls 112 (which are now deformed) are approximately 0.0005 to 0.002 inches thick.

In the preferred embodiment, the CCD die is a 503 by 768 pixel silicon device that is approximately 0.550 by 0.450 inches and is lapped to a thickness of 10–20 microns. It is desirable that the carrier 130 have the same or similar coefficient of thermal expansion as the CCD die to minimize stresses and warping of the CCD die. In the preferred embodiment, the carrier is formed from Pyrex that is approximately 0.650 by 0.550 inches and approximately 0.030–0.040 thick. Alternatively, the carrier may be formed from other materials including silicon, aluminum nitride, LZS (available from Ceramic Processing Systems of Chartly, Mass.). In the preferred embodiment, the glass frit used in glass layer 120 is Ferro 2004 (available from Ferro Corp., of Cleveland, Ohio). The final layer of glass 120 is sintered to near full theoretical density and is less than 0.001 inches thick which is substantially less than the thickness of the carrier 130. Thus, the effects of thermal expansion and contraction of the glass layer do not significantly affect the performance or operation of the CCD die. In this configuration, the stresses on the thinned and now fragile die due to thermal expansion and contraction of the die assembly are minimized.

Preferably, the CCD die carrier assembly (110, 120, 130) is mounted to a header 150 which includes leads or pins 154 that facilitate connection of the CCD to the circuit (not shown). Where differences in coefficients of thermal expansion between the carrier 130 and the header 150 may affect the performance of the device 100, a spacer 140 can be mounted between the carrier 130 and the header 150 such as disclosed in commonly owned U.S. patent application Ser. No. 08/986,259 by W. Robbins, entitled "Integrated Circuit Header Assembly and Method for Making Same," which is hereby incorporated by reference in its entirety. Preferably, the spacer 140 is selected from a material that has a coefficient of thermal expansion between that of the carrier and that of the header to minimize the effects of unequal thermal expansion. In addition, the width and length (or diameter) of the spacer can be substantially less than the dimensions of the carrier 130 and the header 150 to reduce the effects of thermal expansion mismatch. In the preferred embodiment, the spacer 140 is 0.400 by 0.400 inches and 0.100 inches thick.

Figure 2:
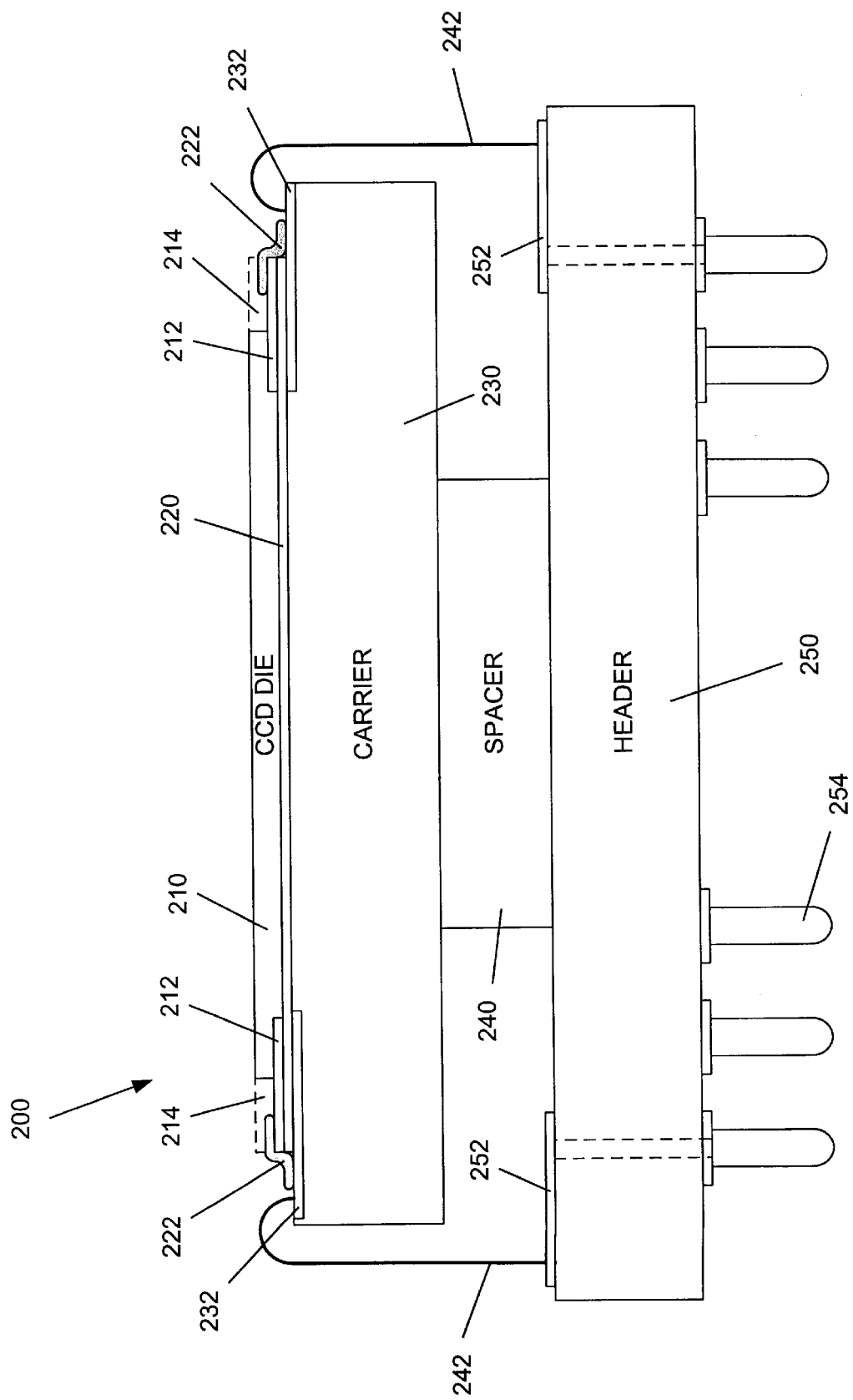
FIG. 2 is a diagrammatic view of a circuit device according to an alternate embodiment of the present invention.

FIG. 2 shows a circuit device 200 in accordance with an alternate embodiment of the present invention. The circuit device 200 is, except where indicated, the same construction as the circuit device 100 shown in FIG. 1. Circuit device 200 includes a thinned die 210, the front side of which is mechanically attached to a carrier 230 by a layer of glass 220. The front side of the thinned CCD die includes conductive pads 212 which are electrically connected to the CCD array. The carrier 230 also includes conductive pads 232, however, these pads are not necessarily congruent with the conductive pads 212 of the CCD die. In this embodiment, the carrier 230 is sufficiently larger than the CCD die and the conductive pads 232 of the carrier 230 are exposed along one or more peripheral edges of the carrier 230. In addition, after the CCD die 210 is attached to the carrier 230 using the layer of glass 220, the pads 212 on the front side of the CCD die 210 are exposed, such as by etching or lapping of the CCD die 210 material covering the conductive pads 212. In this embodiment, the layer of glass 220 can be thinner than the layer of glass 120 in the embodiment of FIG. 1.

Instead of using ball bonds, the conductive pads 212 of the die can be electrically connected to the conductive pads 232 of the carrier by any known method. Preferably, the electrical connection is provided by the application of a thin or thick film of conductive material. Preferably, the conductive material is a metal material such as aluminum although a conductive ceramic material such as titanium nitride can also be used. Alternatively, wire bonds can be used to electrically connect the pads 212 of the CCD die 210 to the pads 232 of the carrier 230.

In a manner similar to the embodiment shown in FIG. 1, the CCD die carrier assembly 210, 220, 230 can be mount to a header 250, either directly or via a pedestal type spacer 240 as discussed above. Wire bonds 242 can be used to interconnect conductive pads 252 and leads 254 with the pads 232 of the carrier 230. Alternatively, the carrier 230 can be provided with conductive pads (not shown) on the side adjacent the header 250 which are connected to pads 232 and ball bonds (not shown) can be used to electrically connect the pads 232 of the carrier 230 to the pads 252 on the header.

Figure 3:
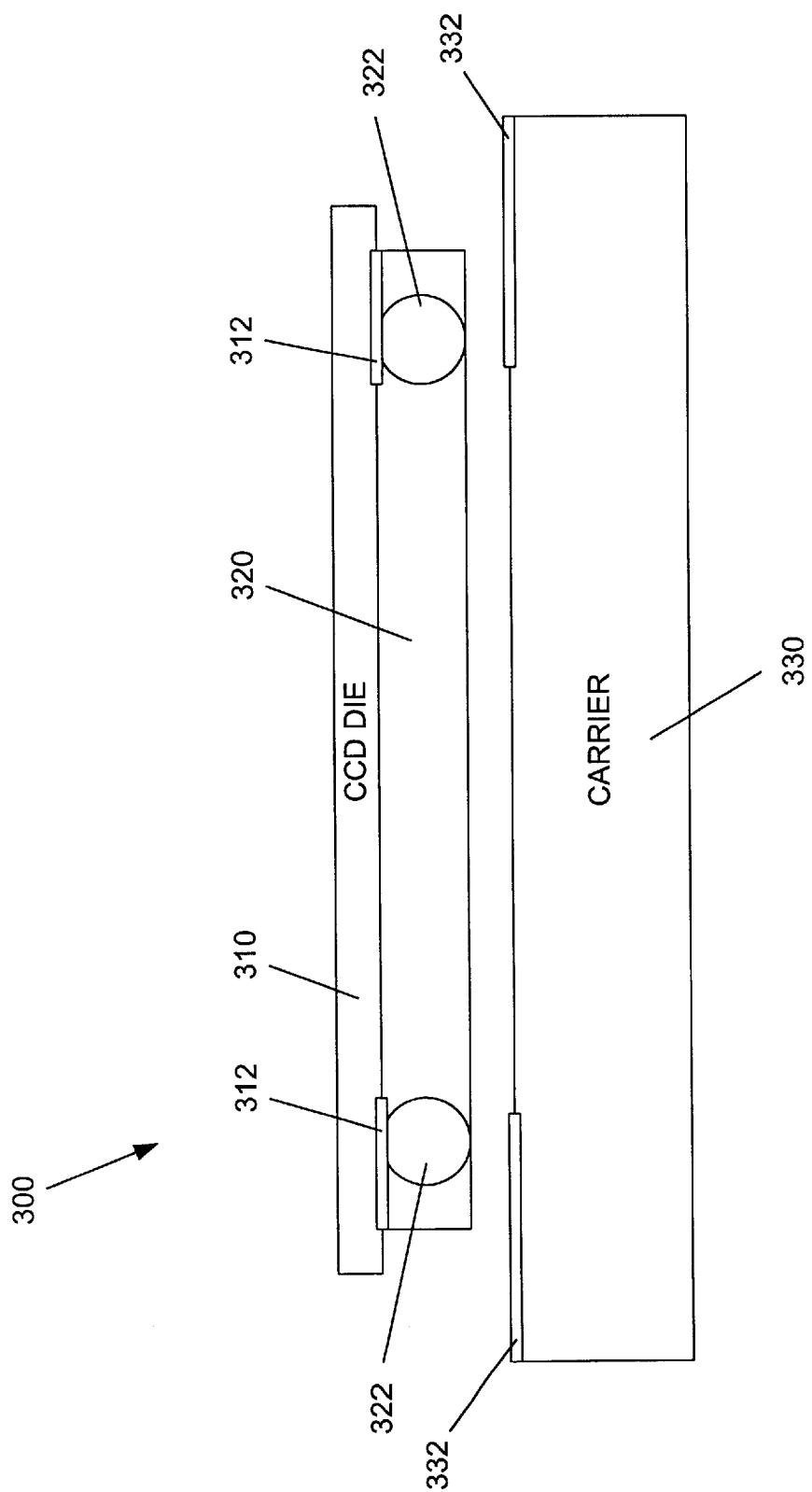
FIG. 3 is a diagrammatic view of a method of making a circuit device according to the present invention.
Figure 4:
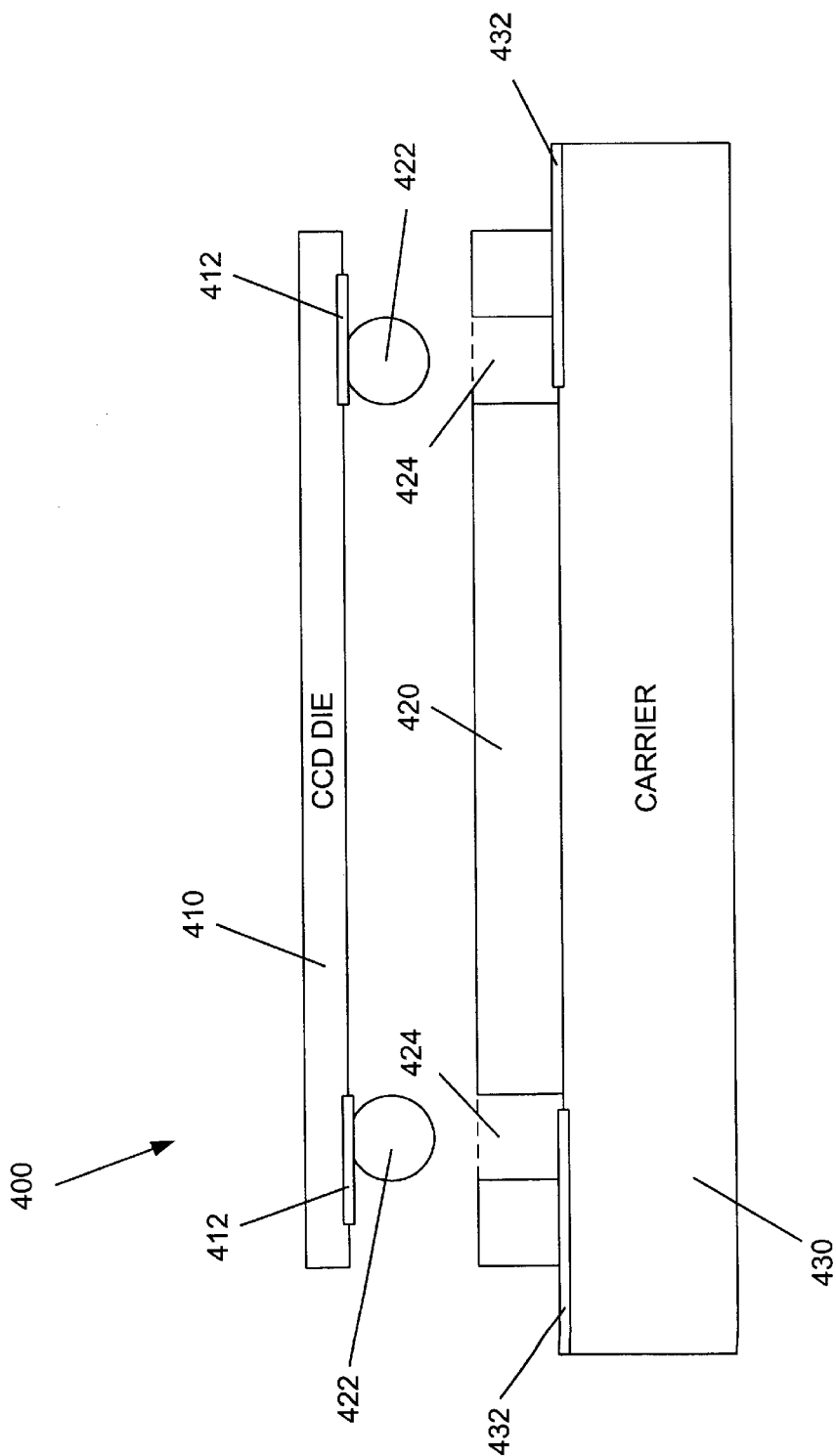
FIG. 4 is a diagrammatic view of a method of making a circuit device according to an alternate embodiment of the present invention.

FIGS. 3 and 4 show alternate methods of fabricating the CCD die carrier assembly of FIG. 1 in accordance with the present invention. As described above, the method provides for attaching bonding balls 322, 422 to the conductive pads 312, 412 of the CCD die or the conductive pads 332, 432 of the carrier 330 and applying a layer of glass 320, 420 to either the CCD die 310, 410 or the carrier 330, 430. Then the layer of glass 320, 420 and balls 322, 422 are compressed between the CCD die 310, 410 and carrier 330, 430 under controlled temperature conditions whereby the mechanical connections between the CCD die 310, 410 and the carrier 330, 430 and electrical connections between pads 312, 412, pads 332, 432 and balls 322, 422 are formed simultaneously.

As shown in FIG. 3, the CCD die carrier assembly is fabricated by attaching gold bonding balls 322 to conductive pads 312. Preferably, the bonding balls 312 are approximately 0.003 to 0.004 inches in diameter. The conductive pads 312 and conductive pads 332 can be plated or otherwise provided with a layer of titanium, platinum and gold to prevent intermetallic interaction. After the bonding balls are attached, a layer of glass 320 is applied to a thickness substantially the same as the height (diameter) of the bonding balls 322, preferably 0.003 to 0.004 inches. The layer of glass 320 and by lapping,g balls 322 are processed, such as by lapping, to reduce the thickness to 0.001 to 0.002 inches. The lapping process provides that the thickness of the glass layer 320 and the distance between the CCD die 310 and the carrier 330 are uniform over the glass layer 320.

In the preferred embodiment, the glass layer 320 is composed of Ferro type 2004 (fine particle grind such as MVG grind) glass frit and formed on the CCD die 310 by the application of three layers. The first layer is formed from a thin layer, approximately less than 0.001 inches, of glass frit that is applied with an air brush. The first layer is fired in a belt furnace at a peak temperature of 400–410 degrees C. for 3–5 minutes to produce a layer of glass that is sintered near full theoretical density. The second and third layers are each air brush applied to a thickness of 0.001 to 0.0015 inches and fired in a belt furnace at a peak temperature of 350 to 380 deg. C. for 3–5 minutes to produce a glass that is partially sintered to approximately 40 to 70 percent of theoretical density. The resulting glass layer 320 is such that thermal expansion characteristics of the glass do not have any detrimental effects on the CCD die 310.

The glass layer 310 is lapped to reduce the thickness to approximately 0.0010 to 0.0015 inches. The glass layer 310 is then compressed between the CCD die 310 and carrier 330 under predefined temperature and pressure conditions. Preferably, the CCD die carrier assembly is compressed at a pressure of approximately 32 psi (approximately 8 pounds on a 0.5 by 0.5 in die) and fired in a belt furnace at a peak temperature of 410 deg. C. for 3–5 minutes, allowed to cool and then compressed at a pressure of approximately 64 psi (approximately 16 pounds on a 0.5 by 0.5 in die) and fired in a belt furnace at a peak temperature of 410 deg. C. for 3–5 minutes. In the finished assembly, the glass layer 320 is less than 0.001 inches thick and the glass is sintered to near full theoretical density. The ball bonds 322 are also compressed to less than 0.001 inches high.

The resulting CCD die carrier assembly can be processed further to thin (or reduce the thickness of) the CCD die 310. Preferably, the carrier 330 facilitates fixturing and provides mechanical support as the CCD die 310 is thinned to between 10 and 20 microns. The CCD die 310 can be thinned using any known process such as etching.

FIG. 4 shows an alternative method of fabricating the CCD die carrier assembly shown in FIG. 1. This embodiment is similar to the embodiment shown in FIG. 3, however, the glass layer 420 is formed on the carrier 430 as opposed to the CCD die 410. The benefit of this embodiment is that the CCD die 410 is not exposed to the thermal cycling used to produce the glass layer 420 as with the embodiment shown in FIG. 3.

In the embodiment shown in FIG. 4, the CCD die carrier assembly is fabricated by attaching gold bonding balls 422 to conductive pads 412. Preferably, the bonding balls 422 are approximately 0.003 to 0.004 inches in diameter. The conductive pads 412 and conductive pads 432 can be plated or otherwise provided with a layer of titanium, platinum and gold to prevent intermetallic interaction. In this embodiment, the layer of glass 420 is applied to the carrier 430 to a thickness substantially the same as the height (diameter) of the bonding balls 422, preferably 0.003 to 0.004 inches. Preferably, the glass layer 420 is composed of the same Ferro type 2004 glass material and formed by the application of three layers as described above. The bonding balls 422 on the CCD die 410 are processed, such as by lapping or coining, to reduce the thickness to 0.001 to 0.002 inches. The glass layer 420 on the carrier 430 is also processed, such as by lapping, to reduce its thickness to 0.0010 to 0.002 inches. The lapping process provides that the thickness of the glass layer 420 and the distance between the CCD die 410 and the carrier 430 are uniform. In addition, the glass layer 420 is further processed to remove the glass material to provide openings 424 that expose the conductive pads 432 on the carrier 430. The opening 424 are of sufficient size to accommodate the bonding balls 422.

In a manner similar to the embodiment of FIG. 3 above, the bonding balls 422 are aligned or registered with the exposed pads 432 and the CCD die 410 and the carrier 430 are joined by the application of heat and pressure as described above. The application of heat and pressure simultaneously establishes the mechanical connection and the electrical connections between the CCD die 410 and the carrier 430. In the finished assembly, the glass layer 420 is less than 0.001 inches thick and the glass is sintered to near full theoretical density. The ball bonds 422 are also compressed to less than 0.001 inches high.

Figure 5:
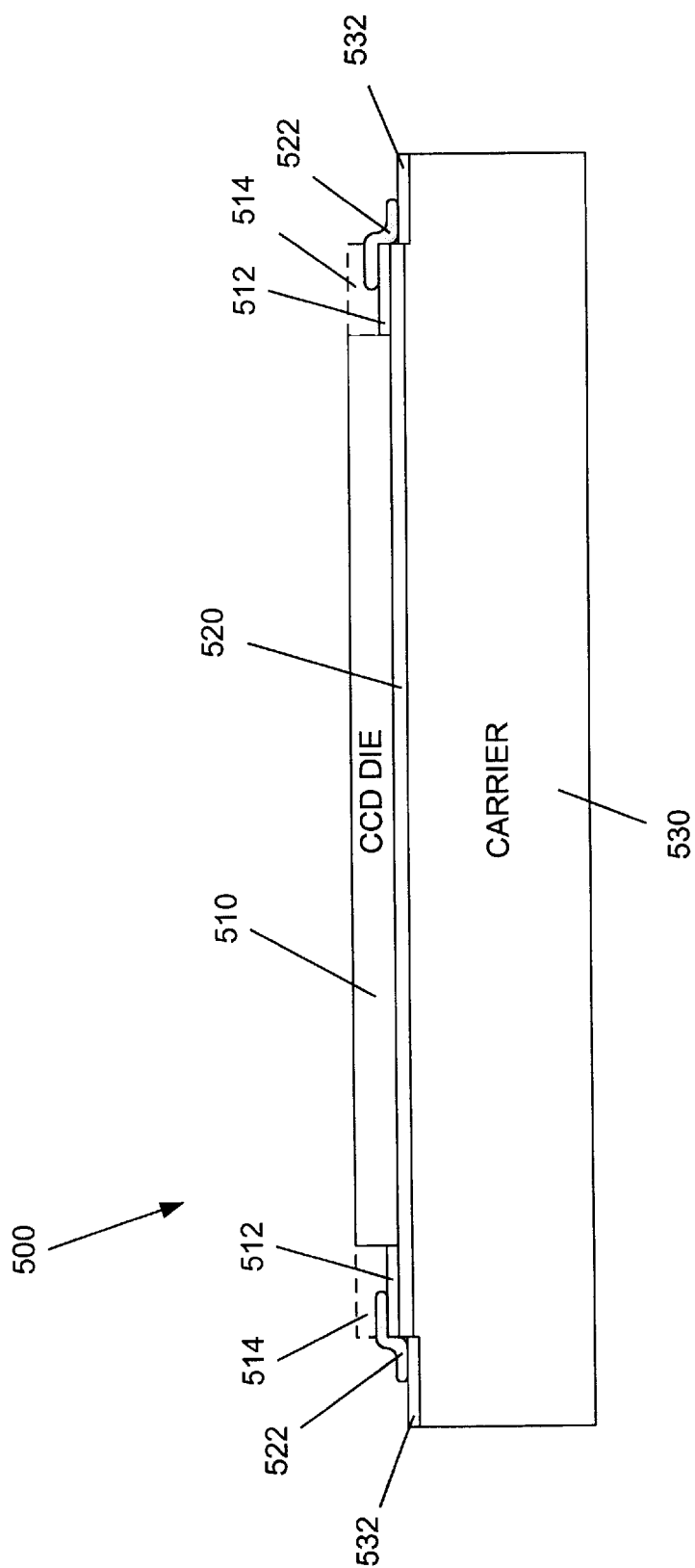
FIG. 5 is a diagrammatic view of a method of making a circuit device according to an alternate embodiment of the present invention.

FIG. 5 shows a method of fabricating the CCD die carrier assembly of FIG. 2 in accordance with the present invention. This method differs from the methods shown in FIGS. 3 and 4 because ball bonds are not used to create the electrical connection between the conductive pads 512 of the CCD die 510 and the conductive pads 532 of the carrier 530. In this embodiment, the glass layer 520 can be much thinner than the embodiments of FIGS. 1, 3 and 4. Preferably, the glass layer 520 is approximately, 0.00025 to 0.0005 inches thick. In addition, the electrical connections between the conductive pads 512 of the CCD die 510 and the conductive pads 532 of the carrier 530 can be formed by an known means, for example wire bonding or by the application of thin or thick film conductive materials.

In this embodiment, the glass layer 520 is also composed of Ferro type 2004 (MVG grind) glass frit and formed on the carrier 530 by the application of two layers. The first layer is formed from a thin layer, approximately less than 0.001 inches, of glass frit that is applied with an air brush. The first layer is fired in a belt furnace at a peak temperature of 400–410 degrees C. for 3–5 minutes to produce a layer of glass that is sintered near full theoretical density. The second layers is air brush applied to a thickness of 0.001 to 0.0015 inches and fired in a belt furnace at a peak temperature of 350 to 380 deg. C. for 3–5 minutes to produce a glass that is partially sintered to approximately 40 to 70 percent of theoretical density. The resulting glass layer 320 is such that thermal expansion of the glass does not have any detrimental effects on the CCD die 310.

The glass layer 520 is lapped to reduce the thickness to be less than approximately 0.001 inches. The glass layer 520 is then compressed between the CCD die 310 and carrier 330 under predefined temperature and pressure conditions. Preferably, the CCD die carrier assembly is compressed at a pressure of approximately 32 psi (approximately 8 pounds on a 0.5 by 0.5 in die) and fired in a belt furnace at a peak temperature of 410 deg. C. for 3–5 minutes, allowed to cool and then compressed at a pressure of approximately 64 psi (approximately 16 pounds on a 0.5 by 0.5 in die) and fired in a belt furnace at a peak temperature of 410 deg. C. for 3–5 minutes. In the finished assembly, the glass layer 320 is less than 0.00075 inches thick and the glass is sintered to near full theoretical density.

As one of ordinary skill will appreciate, the firing temperatures and times are determined as a function of the characteristics of the glass mounting material used to form the bonding layer 120, 220, 320, 420, 520 in FIGS. 1–5, respectively. While glass materials are preferred for ultra-high vacuum applications because they do not out gas, other materials may be suitable for low or non vacuum applications. These mounting materials can include organic and inorganic adhesives (for example, thermal and UV curing adhesives) and cement.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A circuit device comprising:

an integrated circuit die having conductive pads;

a carrier having conductive pads;

a mounting means for mounting said integrated circuit die to said carrier, said mounting means being substantially unsusceptible to outgassing in ultrahigh vacuum environments at temperatures at least up to about 900 degrees C.; and a first conducting means for electrically connecting at least one of said conductive pads of said integrated circuit die to at least one of said conductive pads of said carrier.

2. A circuit device according to claim 1 wherein said mounting means comprises an inorganic material.

3. A circuit device according to claim 2 wherein said mounting means comprises an inorganic material having a predefined sintered density.

4. A circuit device according to claim 1 wherein said mounting means comprises a glass material.

5. A circuit device according to claim 4 wherein said mounting means comprises a glass material having a predefined sintered density.

6. A circuit device according to claim 4 wherein said glass material is at least partially sintered.

7. A circuit device according to claim 1 wherein said die has a characteristic coefficient of thermal expansion and said carrier has a characteristic coefficient of thermal expansion that is sufficiently similar to the coefficient of thermal expansion of said die to permit operation of said die over a predefined temperature range.

8. A circuit device according to claim 1 wherein said first conducting means includes ball bonds connecting at least one of the conductive pads of the die with the conductive pads of the carrier.

9. A circuit device according to claim 1 wherein said first conducting means includes wire bonds connecting at least one of the conductive pads of the die with the conductive pads of the carrier.

10. A circuit device according to claim 1 wherein said first conducting means includes a thick or thin film of a conductive material applied to said die and said carrier connecting at least one of the conductive pads of the die with the conductive pads of the carrier.

11. A circuit device according to claim 1 wherein said die is a charged coupled device (CCD).

12. A circuit device according to claim 11 wherein said die is a backside illumination CCD.

13. A circuit device comprising:

a charge coupled device (CCD) die having electrically conductive pads;

a carrier having electrically conductive pads;

a mounting means for mounting said CCD die to said carrier, said mounting means being substantially unsusceptible to outgassing in ultrahigh vacuum environments at temperatures at least up to about 900 degrees C.; and a first conducting means for electrically connecting at least one of said conductive pads of said CCD die to at least one of said conductive pads of said carrier.

14. A circuit device according to claim 13 wherein said mounting means comprises an inorganic material.

15. A circuit device according to claim 13 wherein said mounting means comprises a glass material.

16. A circuit device according to claim 14 wherein said glass material is at least partially sintered.

17. A circuit device according to claim 13 wherein said CCD die has a characteristic coefficient of thermal expansion and said carrier has a characteristic coefficient of thermal expansion that is sufficiently similar to the coefficient of thermal expansion of said CCD die to permit operation of said CCD die over a predefined temperature range.

* * * * *